United States Patent
Corry et al.

(10) Patent No.: US 9,909,217 B2
(45) Date of Patent: Mar. 6, 2018

(54) PUMP USED IN GASIFICATION SYSTEM

(75) Inventors: Judeth Brannon Corry, Manvel, TX (US); James Michael Storey, Houston, TX (US); Minghu Guo, Shanghai (CN); Wei Chen, Shanghai (CN); Cai Zeng, Shanghai (CN); Richard L. Zhao, Chicago, IL (US); Steven Craig Russell, Houston, TX (US)

(73) Assignee: General Electric Company, Schenectady, NY (US)

( * ) Notice: Subject to any disclaimer, the term of this patent is extended or adjusted under 35 U.S.C. 154(b) by 1298 days.

(21) Appl. No.: 13/404,088

(22) Filed: Feb. 24, 2012

(65) Prior Publication Data

US 2012/0219409 A1     Aug. 30, 2012

(30) Foreign Application Priority Data

Feb. 28, 2011  (CN) ........................ 2011 1 0047329
Jun. 10, 2011  (CN) ........................ 2011 1 0155635

(51) Int. Cl.
*F04D 7/04*        (2006.01)
*C23C 30/00*       (2006.01)
(Continued)

(52) U.S. Cl.
CPC .............. *C23C 30/00* (2013.01); *C10J 3/30* (2013.01); *C10J 3/50* (2013.01); *C23C 8/02* (2013.01);
(Continued)

(58) Field of Classification Search
CPC ........... F04D 7/02; C23C 12/00; C23C 14/48; C23C 8/02; C23C 8/20; C23C 8/22;
(Continued)

(56) References Cited

U.S. PATENT DOCUMENTS 3,953,178 A * 4/1976 Engel ...................... C21D 1/09
                                                 428/627
4,010,775 A    3/1977 Roberts
(Continued)

FOREIGN PATENT DOCUMENTS

CN          1366091 A      8/2002
CN          1589373 A      3/2003
(Continued)

OTHER PUBLICATIONS

Stephenson et al., "Hardfacing by chemical Vapor Deposition of Components used in Coal Gasification Units", Thin Solid Films, vol. 40, pp. 73-80, Jan. 1977.
(Continued)

*Primary Examiner* — Woody Lee, Jr.
*Assistant Examiner* — Maxime Adjagbe
(74) *Attorney, Agent, or Firm* — GE Global Patent Operation

(57) ABSTRACT

A pump used in a gasification system, the pump comprises a housing having an inlet and an outlet, a rotor supported within the housing for rotation relative to the housing, the rotor comprising a hub, a plurality of disks spaced apart by sections of the hub, and defining a plurality of transport channels for transporting solid carbonaceous feedstocks for the gasification system, and an interior feedstock facing surface adjacent to the solid carbonaceous feedstocks, wherein at least a portion of the interior feedstock facing surface is coated with a coating.

18 Claims, 1 Drawing Sheet

(51) Int. Cl.

| | | |
|---|---|---|
| *C23C 8/02* | (2006.01) | |
| *C23C 8/20* | (2006.01) | |
| *C23C 8/22* | (2006.01) | |
| *C23C 8/24* | (2006.01) | |
| *C23C 8/26* | (2006.01) | |
| *C23C 8/30* | (2006.01) | |
| *C23C 8/32* | (2006.01) | |
| *C23C 8/36* | (2006.01) | |
| *C23C 8/38* | (2006.01) | |
| *C23C 14/16* | (2006.01) | |
| *C23C 14/48* | (2006.01) | |
| *C23C 14/58* | (2006.01) | |
| *C10J 3/30* | (2006.01) | |
| *C10J 3/50* | (2006.01) | |

(52) U.S. Cl.
CPC .............. *C23C 8/20* (2013.01); *C23C 8/22* (2013.01); *C23C 8/24* (2013.01); *C23C 8/26* (2013.01); *C23C 8/30* (2013.01); *C23C 8/32* (2013.01); *C23C 8/36* (2013.01); *C23C 8/38* (2013.01); *C23C 14/16* (2013.01); *C23C 14/48* (2013.01); *C23C 14/586* (2013.01); *C23C 14/5846* (2013.01); *C10J 2200/15* (2013.01); *C10J 2300/093* (2013.01); *C10J 2300/0916* (2013.01); *C10J 2300/0943* (2013.01); *C10J 2300/0946* (2013.01)

(58) Field of Classification Search
CPC .... C23C 8/24; C23C 8/26; C23C 8/30; C23C 8/32; C23C 8/36; C23C 8/38; C23C 14/16; C23C 14/5846; C23C 14/586; C10J 3/30; C10J 3/50
See application file for complete search history.

(56) References Cited

U.S. PATENT DOCUMENTS

| | | |
|---|---|---|
| 4,428,717 A | 1/1984 | Catterfeld |
| 4,755,134 A | 7/1988 | Engstrom et al. |
| 4,974,998 A | 12/1990 | Heineman |
| 5,061,457 A | 10/1991 | Hsieh et al. |
| 7,803,234 B2 | 9/2010 | Yeung et al. |
| 2003/0175110 A1* | 9/2003 | Schmidt et al. ............. 415/55.1 |
| 2010/0272563 A1 | 10/2010 | Chiovelli |
| 2012/0006624 A1 | 1/2012 | Russell et al. |
| 2012/0205222 A1* | 8/2012 | Russell et al. ................ 198/804 |

FOREIGN PATENT DOCUMENTS

| | | |
|---|---|---|
| CN | 1570394 A | 1/2005 |
| CN | 1669725 A | 9/2005 |
| CN | 101128224 A | 2/2008 |
| CN | 101666317 A | 3/2010 |
| CN | 101725539 A | 6/2010 |
| GB | 2061399 A | 5/1981 |
| JP | 5627391 U | 3/1981 |
| JP | 5666486 A | 6/1981 |
| JP | 59034499 A | 2/1984 |
| JP | 60098799 U | 7/1985 |
| JP | 61084193 U | 6/1986 |
| JP | 07278783 A | 10/1995 |
| JP | 08176670 A | 7/1996 |
| JP | 2001153063 A | 6/2001 |
| WO | 2003089842 A1 | 10/2003 |

OTHER PUBLICATIONS

Office action from corresponding CN Application No. 201110155635.5, dated Jun. 27, 2013.

Bal Seal Engineering, "Ion Implantation, PVD and CVD and their Effects on Bal Seal Performance", Technical Report TR-24, http://www.balseal.com/sites/default/files/tr24_020707131625.pdf, pp. 1-9, Jul. 5, 2002.

Unofficial English Translation of Japanese Office Action issued in connection with corresponding JP Application No. 2012039534 dated Nov. 24, 2015.

Australian Examination Report issued in connection with corresponding AU Application No. 2012201138 dated Dec. 4, 2015.

Unofficial English translation of Office Action issued in connection with corresponding CN Application No. 201110155635.5 dated Jan. 14, 2015.

Unofficial English Translation of Japanese Office Action issued in connection with corresponding JP Application No. 012039534 dated Aug. 9, 2016.

* cited by examiner

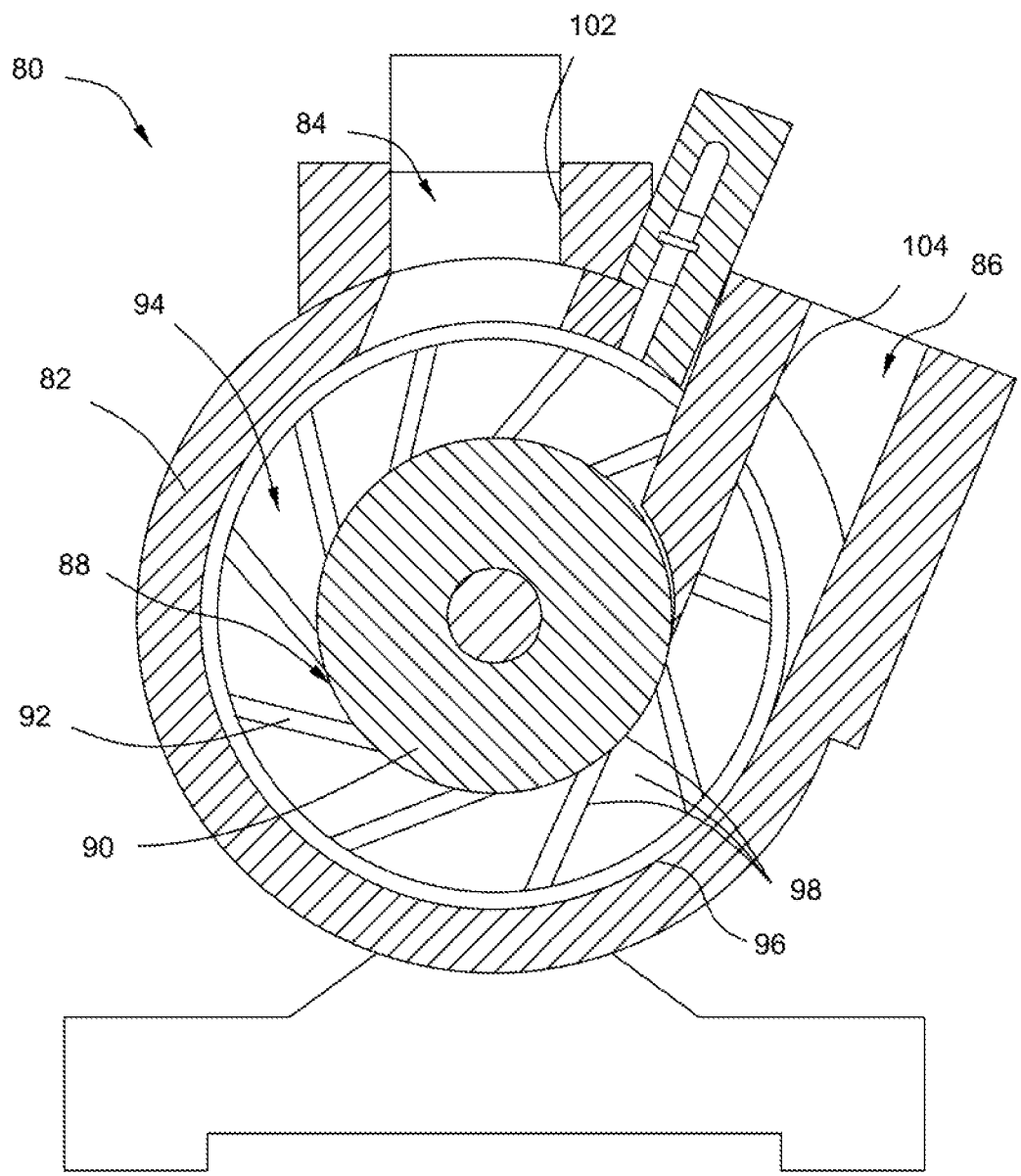

PUMP USED IN GASIFICATION SYSTEM

BACKGROUND OF THE INVENTION

Field of the Invention

Embodiments of the present invention relate, in general, to pumps used in a gasification system, and, more specifically, to pumps with enhanced abrasion resistance.

Description of the Prior Art

Pumps used in a gasification system, such as a coal gasification system, usually suffer severe abrasion and damage after a quite short period of use. These abrasion damages not only reduce the reliability of gasification, but also make the cost of gasification increase. Therefore it is a significant issue to enhance the abrasion resistance of pumps to prolong their working life and develop more reliable gasification system and process.

BRIEF SUMMARY OF THE INVENTION

According to an embodiment of the present invention, there is provided a pump used in a gasification system, the pump comprises a housing having an inlet and an outlet, a rotor supported within the housing for rotation relative to the housing, the rotor comprising a hub, a plurality of disks spaced apart by sections of the hub, and defining a plurality of transport channels for transporting solid carbonaceous feedstocks for the gasification system, and an interior feedstock facing surface adjacent to the solid carbonaceous feedstocks, wherein at least a portion of the interior feedstock facing surface is coated with a coating.

According to another embodiment of the present invention, there is provided a method for enhancing abrasion resistance of a pump used in a gasification system, the method comprising coating at least a portion of an interior feedstock facing surface of the pump with a coating.

BRIEF DESCRIPTION OF THE DRAWINGS

Embodiments of the present invention will be described herein below with reference to the accompanying drawings. In the subsequent description, well-known functions or constructions are not described in detail to avoid obscuring the disclosure in unnecessary detail. In the drawings:

FIG. 1 is a schematic view of cross-section of an exemplary pump, in accordance with an embodiment of the present invention.

DETAILED DESCRIPTION OF THE INVENTION

"Gasification system" or "gasification apparatus", as used herein, shall mean a system for converting carbonaceous materials, such as coal, coke, biomass, bitumen, or carbon-containing waste into carbon monoxide and hydrogen by reacting the raw material at high temperatures with a controlled amount of oxygen and/or steam.

Referring to FIG. 1, in the illustrated example, a pump 80 used in a gasification apparatus for transporting solid carbonaceous feedstocks comprises a housing 82 having an inlet 84 for receiving carbonaceous material and an outlet 86 for discharging carbonaceous material, and a drive rotor 88 supporting the housing 82 for rotation relative to the housing 82. The rotor 88 is configured with a hub 90 and a plurality of disks 92 spaced apart by sections of the hub 90, which define a plurality of transport channels 94 communicating with the inlet 84 and the outlet 86. When the pump 80 is used in a gasification apparatus, a solid carbonaceous feedstock, a feedstock comprising solid carbonaceous material, and optionally further comprising other solids, liquids or gases, is fed into the pump 80 from the inlet 84, and by driving the rotor 88, the disks 92 act on the carbonaceous material in the transport channels 94 to cause them moving towards the outlet 86. The pump 80 comprises a feedstock facing interior surface adjacent to the solid carbonaceous feedstocks. In one embodiment, the feedstock facing interior surface comprises an internal surface 96 of the housing 82, a surface 98 defined by the disks 92 and hub sections between the disks 92, an internal surface 102 of the inlet 84 and internal surface 104 of the outlet 86. In certain embodiments, at least a portion of the feedstock facing interior surface is coated with a coating. The "coating", as used herein, may be a removable layer installed on an original surface, or a coating achieved by treating or modifying an original surface in a surface treatment or modification process, in which (1) a coating is applied to the surface, (2) chemical species are adsorbed onto the surface, (3) the chemical nature (e.g., electrostatic charge) of chemical groups on the surface are altered, and/or (4) the surface properties are otherwise modified. In one embodiment, the coating is a removable and replaceable wear-resistant layer installed on at least a portion of the feedstock facing interior surface. The wear-resistant layer can be installed using means including but not limited to fasteners, geometric features, welding, brazing, and/or adhesives. In another embodiment, the coating is applied with a surface treatment process including ion implantation and penetration. In another embodiment, the whole feedstock facing interior surface is coated with the coating.

The pump can be made from metal or alloy. In certain embodiments, at least a portion of the pump is made from a nickel, cobalt or iron based alloy.

In certain embodiments, the ion implantation is carried out by: placing the pump in a processing chamber, supplying gas, including argon, into the processing chamber to create a vacuum of about 0.002 Pa, generating plasma by thermionic emission, radio frequency, or microwave excitation to make the pump immersed in the plasma, taking the pump as a negative pole, a member (such as a metal foil) made from the element(s) to be implanted into the pump as a positive pole; and imposing a single field pulse voltage in a range from approximately 10 MeV to approximately 20 MeV to urge electrons in the plasma to move from the pump to the positive pole and positive ions to rush to the pump, which acts as a negative pole. As the pump is immersed in the plasma, the positive ions are implanted to the surface of the pump from various directions. After the implantation, an implanted layer with a thickness of around 10 nm to 50 μm is formed. The element(s)/ions to be implanted can be W, V, Nb, Cr or their combination.

The pump is subsequently subjected to penetration, which might be carburizing, nitriding, carbonitriding, or other diffusion treatments involving elemental additions to the surface. Taking carburizing as an example, in certain embodiments, it could be carried out by: annealing the pump after ion implantation in approximately 800° C. for about an hour, preparing a carburizing furnace by heating the carburizing furnace to approximately 800° C., supplying a carburant or a cracking gas such as methanol into the carburizing furnace, and then further heating the carburizing furnace to a carburizing temperature in a range between approximately 920° C. to approximately 940° C. and maintaining the carburizing furnace at the carburizing temperature for about 1~2 hours till the carburant or gas in the furnace becomes regularly flowing, and placing the pump into the carburizing furnace for carburizing for about 1~2 hours under pressure of about 50~100 Pa. During the carburizing, the carbon atoms that diffused into the pump to react with the implanted ions in the implanted layer to form a diffused layer comprising carbide of the implanted element(s), such as W, V, Nb, Cr. However, if penetration other than carburizing is applied, a diffused layer comprising other compound would be formed. For example, if the implanted component is subjected to a nitriding process, a diffused layer comprising nitride of W, V, Nb, Cr and/or etc would be formed. A thickness of the diffused layer may be below 2 mm. In one embodiment, a thickness of the diffused layer is approximately 1 mm.

In certain embodiments, the coating achieved by ion implantation and penetration processes includes both the implanted layer formed by the ion implantation process and the diffused layer further formed by the penetration process.

Element distribution measured by an X-ray Photoelectron Spectroscopy (XPS) shows that a concentration gradient is obtained in the coating, and the adhesion of the coating is much higher than a deposited layer in which a concentration mutation may occur. A Vickers hardness of the coating may be above 1500 Hv. In certain embodiments, a Vickers hardness of the coating is between approximately 2000 Hv to approximately 3000 Hv, and an abrasion resistance of the coating is about 2~3 times higher than that of a surface without such a coating. Moreover, as a result of the coating, a certain compressional stress is generated on the surface of the component, therefore cracks on the component can be prevented and anti-fatigue performance of the pump can be enhanced, and thereby the pump's working life under a fluctuating temperature environment can be significantly extended.

In certain embodiments, the coating on the feedstock facing interior surface may be other coating materials applied with other processes. Other examples of coating materials that may be used for the pump interior surface include, but are not limited to, MCrAlY (chromium aluminum yttrium) coatings (where M=cobalt, nickel, or cobalt/nickel) and oxides of aluminum, silicon, magnesium, and calcium. Additionally, in certain embodiments, a portion of the feedstock facing interior surface without the coating, or a surface of the pump, other than the feedstock facing interior surface may be coated by other processes, such as aluminizing.

A pump with the coating on its feedstock facing surface is greatly enhanced in hardness and abrasion resistance, and have been demonstrated to be very effective in increasing the working life in the industry for transporting solid carbonaceous materials under atmospheric pressure.

While the disclosure has been illustrated and described in typical embodiments, it is not intended to be limited to the details shown, since various modifications and substitutions can be made without departing in any way from the spirit of the present disclosure. As such, further modifications and equivalents of the disclosure herein disclosed may occur to persons skilled in the art using no more than routine experimentation, and all such modifications and equivalents are believed to be within the spirit and scope of the disclosure as defined by the subsequent claims.

What is claimed is:

1. A pump used in a gasification system, comprising:
   a housing having an inlet and an outlet; and
   a rotor supported within the housing for rotation relative to the housing, the rotor comprising:
      a hub;
      a plurality of disks spaced apart by sections of the hub, wherein the plurality of disks and the sections of the hub define a plurality of transport channels for transporting solid carbonaceous feedstocks for the gasification system; and
      an interior feedstock facing surface adjacent to the solid carbonaceous feedstocks, wherein the interior feedstock facing surface includes a surface defined by the plurality of disks and the sections of the hub, an internal surface of the inlet, and an internal surface of the outlet, wherein the interior feedstock facing surface is coated with an implanted coating applied with ion implantation and further a diffused coating applied with penetration, and wherein at least a portion of the pump is immersed in plasma and at least one positive ion of the plasma is implanted onto the interior feedstock facing surface of the pump during ion implantation.

2. The pump of claim 1, wherein a portion of the pump is made from nickel, cobalt, or iron-based alloy.

3. The pump of claim 1, wherein the ion implantation implants at least one positive ion of at least one of vanadium, niobium, and chromium.

4. The pump of claim 1, wherein the penetration comprises at least one of carburizing, nitriding, and carbonitriding.

5. The pump of claim 1, wherein a thickness of the implanted coating is between 10 nanometers and 50 micrometers.

6. The pump of claim 1, wherein a hardness of the implanted coating and the diffused coating is above 1500 Hv.

7. The pump of claim 1, wherein the solid carbonaceous feedstocks comprise at least one of coal, coke, biomass, bitumen, and carbon-containing waste.

8. The pump of claim 1, wherein the implanted and the diffused coatings are removable and replaceable wear-resistant layer installed on the interior feedstock facing surface.

9. The pump of claim 8, wherein the wear-resistant layer is installed using fasteners, geometric features, welding, brazing, and/or adhesives.

10. A method for enhancing abrasion resistance of a pump used in a gasification system, the method comprising:
    coating an interior feedstock facing surface of the pump with a coating, wherein the interior feedstock facing surface includes an internal surface of a housing of the pump, an internal surface of an inlet of the pump, an internal surface of an outlet of the pump, and a surface defined by a plurality of disks and sections of the hub between the plurality of disks, wherein both the plurality of disks and the sections of the hub are located within the pump, and wherein the coating is applied with ion implantation and further a diffused coating is applied with penetration, the ion implantation comprising:
    immersing at least a portion of the pump in plasma; and
    implanting at least one positive ion of the plasma onto the interior feedstock facing surface of the pump.

11. The method of claim 10, wherein the ion implantation further comprises:
    taking the pump as a negative pole and an implanting member comprising an element to be implanted into the pump as a positive pole; and
    imposing a voltage to urge electrons in the plasma to move to the positive pole and the at least one positive ion of the plasma to move to the pump such that the at least one positive ion is implanted onto the interior feedstock facing surface of the pump.

12. The method of claim 11, wherein the voltage is a pulse voltage ranging from approximately 10 MeV to approximately 20 MeV.

13. The method of claim 10, wherein implanting the at least one positive ion into the pump comprises implanting at least one positive ion of at least one of vanadium, niobium, and chromium.

14. The method of claim 10, wherein a thickness of the implanted coating is between 10 nanometers and 50 micrometers.

15. The method of claim 10, wherein the penetration includes carburizing for about 1~2 hours under a temperature of approximately 920~940° C. and a pressure of approximately 50~100 Pa.

16. The method of claim 10, wherein a thickness of the diffused coating is less than approximately 2 millimeters.

17. The method of claim 10, further comprising annealing the pump between the ion implantation and the penetration.

18. The method of claim 10, wherein the implanted and the diffused coatings are removable and replaceable wear-resistant layer installed on the interior feedstock facing surface through fasteners, geometric features, welding, brazing, and/or adhesives.

* * * * *